United States Patent
Takaso

(10) Patent No.: US 7,816,987 B2
(45) Date of Patent: Oct. 19, 2010

(54) DRIVER CIRCUIT AND DRIVER IC

(75) Inventor: Jun Takaso, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 5 days.

(21) Appl. No.: 12/418,640

(22) Filed: Apr. 6, 2009

(65) Prior Publication Data

US 2010/0102884 A1  Apr. 29, 2010

(30) Foreign Application Priority Data

Oct. 29, 2008  (JP) ............................. 2008-277629

(51) Int. Cl.
*H03F 3/45* (2006.01)

(52) U.S. Cl. ...................................... 330/252; 330/310

(58) Field of Classification Search ................. 330/252, 330/253, 310
See application file for complete search history.

(56) References Cited

U.S. PATENT DOCUMENTS

| | | | | |
|---|---|---|---|---|
| 5,802,464 | A | * | 9/1998 | Ashida ........................ 330/310 |
| 6,075,413 | A | * | 6/2000 | Katakura ..................... 330/252 |
| 7,012,467 | B2 | * | 3/2006 | Morgan et al. ............... 330/261 |

FOREIGN PATENT DOCUMENTS

| | | |
|---|---|---|
| JP | 11-014951 | 1/1999 |
| JP | 11-223802 | 8/1999 |

* cited by examiner

*Primary Examiner*—Khanh V Nguyen
(74) *Attorney, Agent, or Firm*—Leydig, Voit & Mayer, Ltd.

(57) ABSTRACT

A driver circuit comprises: differential amplification stages connected in series, and at least two cross-point adjuster circuits respectively connected to at least two differential amplification stages of the differential amplification stages. The cross-point adjuster circuits control at least one of the positive-phase and negative-phase DC levels of a corresponding differential amplification stage and adjust the cross point of the output signals of the corresponding differential amplification stage.

10 Claims, 8 Drawing Sheets cross point 50% cross point 80%

200
DRIVER CIRCUIT AND DRIVER IC

BACKGROUND OF THE INVENTION

1. Field of the Invention

The present invention relates to a driver circuit for driving an optical modulator or a semiconductor laser, and more specifically, to a driver circuit that can maintain favorable output wave form even when an electric wave form wherein a cross point is deviated from 50% is outputted.

2. Background Art

In optical communication systems, further higher-speed, higher-density, and longer-distance transmission of information have been demanded. For higher-speed transmission, the operating frequency of applications has been raised to 10 Gbps, 40 Gbps, and 100 Gbps. For higher-density transmission, multiplexed communications such as DWDM have been used. For relatively short-distance transmission, the semiconductor laser of direct modulator driving has been adopted; and for long-distance transmission, external modulator driving has been adopted.

In external modulator driving, electric absorption modulators (EAM) are mainly used. Change in optical output power of the EAM is non-linear to change in input voltage. Therefore, the driver circuit for driving the EAM must be capable of outputting electric wave form wherein the duty of output wave form is deviated, specifically, the cross point is deviated from 50% (for example, refer to Japanese Patent Application Laid-Open No. 11-14951). The adjustment of the cross point is also useful for improving the optical wave form of the semiconductor laser.

SUMMARY OF THE INVENTION

However, for outputting electric wave form wherein the cross point is deviated from 50%, the driver circuit requires a wide band of the operating frequency or higher. Therefore, a problem of the degradation in output wave forms (high jitter, low-speed Tf/Tf, etc.) was caused as a result of deficiency in the band.

To solve the above-described and other problems, it is an object of the present invention is to provide a driver circuit that can maintain a favorable output wave form even when the electric wave form wherein the cross point is deviated from 50% is outputted.

According to one aspect of the present invention, a driver circuit comprises: a plurality of differential amplification stages connected in series, and at least two cross-point adjuster circuits respectively connected to at least two differential amplification stages of said plurality of differential amplification stages; wherein said cross-point adjuster circuits control at least one of the positive-phase and negative-phase DC levels of a corresponding differential amplification stage to adjust the cross point of the output signals of the corresponding differential amplification stage.

According to the present invention, favorable output wave form can be maintained even when the electric wave form wherein the cross point is deviated from 50% is outputted.

Other and further objects, features and advantages of the invention will appear more fully from the following description.

DETAILED DESCRIPTION OF THE PREFERRED EMBODIMENTS

First Embodiment

Figure 1:
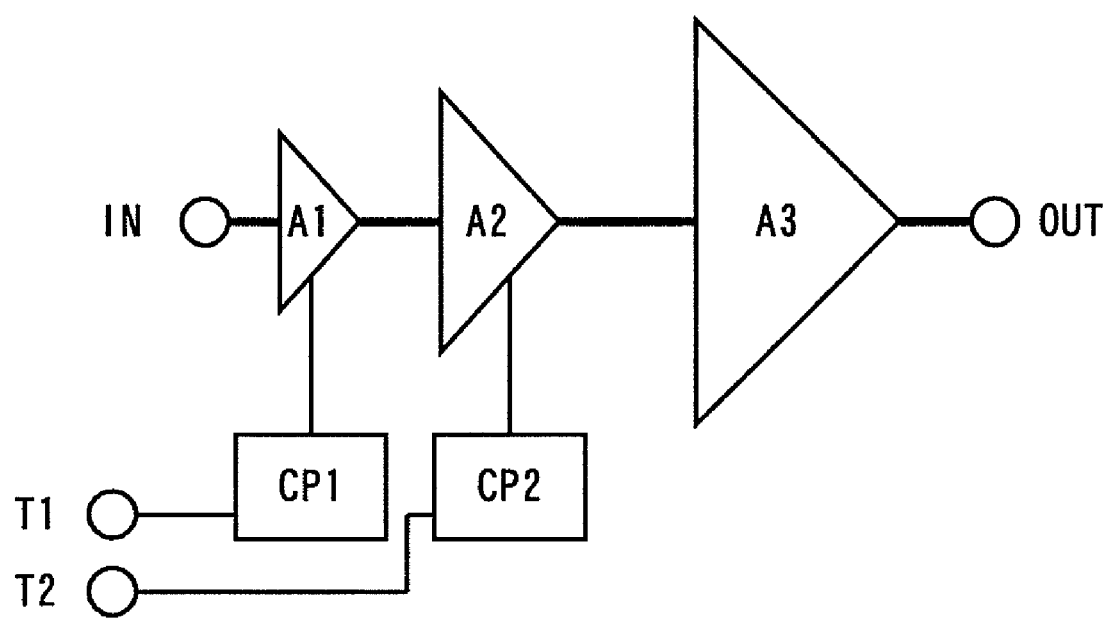
FIG. 1 is a block diagram showing a driver circuit according to the first embodiment on the present invention.

FIG. 1 is a block diagram showing a driver circuit according to the first embodiment on the present invention. The driver circuit is a driver circuit for driving an electric absorption modulator (not shown). The electric absorption modulator absorbs incident light corresponding to the voltage applied from the driver circuit, and outputs strength modulated light signals.

A first amplification stage A1, a second amplification stage A2, and a third amplification stage A3 are connected in series between an input terminal IN and an output terminal OUT. In the first embodiment, cross-point adjuster circuits CP1 and CP2 are connected to the first amplification stage A1 and the second amplification stage A2, respectively.

Here, the cross-point adjuster circuit CP1 controls at least one of the positive-phase and negative-phase DC levels of the first amplification stage A1 to adjust the cross point of the output signals from the first amplification stage A1. The cross-point adjuster circuit CP2 controls at least one of the positive-phase and negative-phase DC levels of the second amplification stage A2 to adjust the cross point of the output signals from the second amplification stage A2. The details will be described later.

Figure 2:
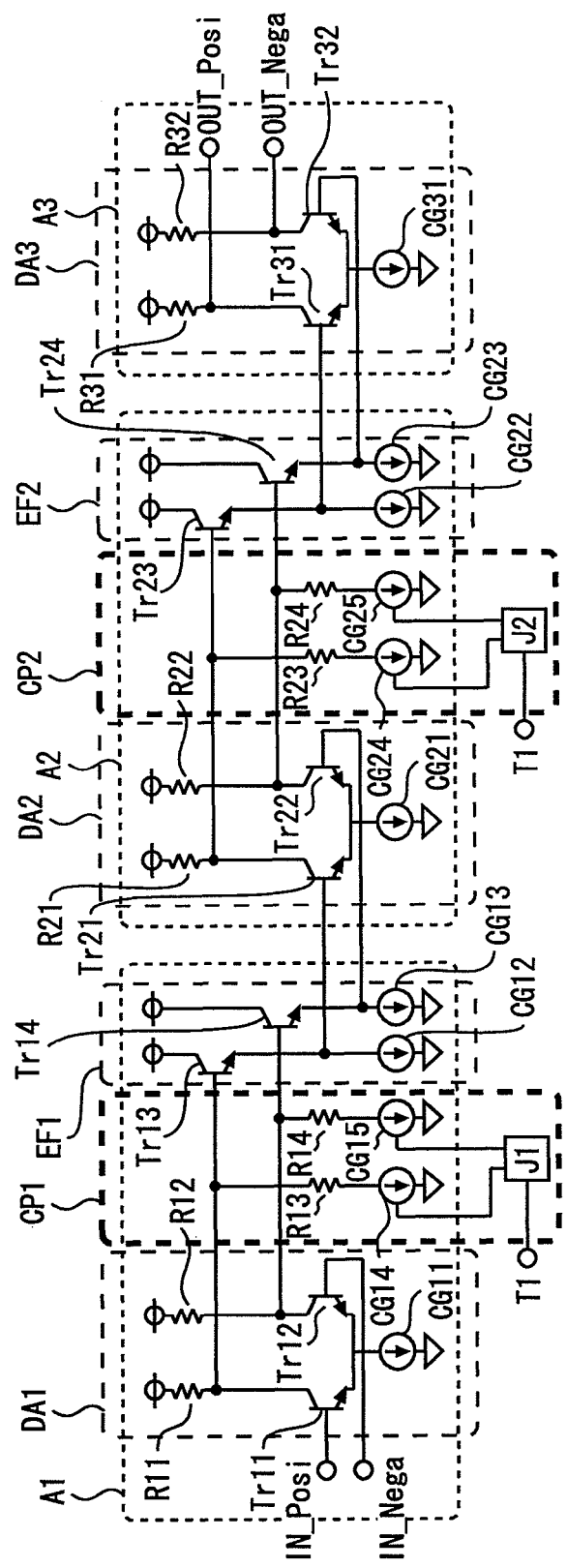
FIG. 2 is a circuit diagram showing a driver circuit according to the first embodiment of the present invention.

FIG. 2 is a circuit diagram showing a driver circuit according to the first embodiment of the present invention. As input terminals IN, a positive-phase input terminal IN_Posi to which the positive phase of the input signals is inputted, and a negative-phase input terminal IN_Nega to which the negative phase of the input signals is inputted, are provided. As output terminals OUT, a positive-phase output terminal OUT_Posi from which the positive phase of the output signals is outputted, and a negative-phase output terminal OUT_Nega from which the negative phase of the output signals is outputted, are provided.

The first amplification stage A1 is composed of a differential amplifier circuit DA1 and an emitter follower circuit EF1. The second amplification stage A2 is composed of a differential amplifier circuit DA2 and an emitter follower circuit EF2. The third amplification stage A3 is composed of a differential amplifier circuit DA3 alone. The differential amplifier circuits DA1, DA2 and DA3 in respective stages operate as limiting amplifiers for limiting outputs to have amplitudes not exceeding predetermined certain values. The gain of respective differential amplifier circuits DA1, DA2 and DA3 can be set up to about 20 dB (voltage amplification factor: about 10-fold); and the limited output amplitudes of the first differential amplifier circuit DA1, the second differential amplifier circuit DA2, and the third differential amplifier circuit DA3 can be set up to 0.5 Vpp, 1.0 Vpp, and 2.0 Vpp, respectively.

A cross-point adjuster circuit CP1 is inserted between the differential amplifier circuits DA1 and the emitter follower circuit EF1 in the first amplification stage A1. A cross-point adjuster circuit CP2 is inserted between the differential amplifier circuits DA2 and the emitter follower circuit EF2 in the second amplification stage A2.

The differential amplifier circuit DA1 in the first amplification stage A1 has load resistors R11 and R12, switching transistors TR11 and TR12, and a constant current source CG11. The base of each of switching transistors TR11 and TR12 is connected to the positive-phase input terminal IN_Posi and the negative-phase input terminal IN_Nega, respectively. The collector of each of switching transistors TR11 and TR12 is connected to the power source via load resistors R11 and R12, respectively. A constant current source CG11 is connected between the emitters of common-connected switching transistors TR11, TR12 and the grounding point. The limited output amplitude of the differential amplifier circuit DA1 is determined by the resistance value of the load resistors R11, R12 and the current value of the constant current source CG11.

The emitter follower circuit EF1 in the first amplification stage A1 has the switching transistors Tr13 and Tr14, and constant current sources CG12 and CG13. The base of each of the switching transistors Tr13 and Tr14 is connected to the collector of each of the switching transistors TR11 and TR12 in the differential amplifier circuit DA1, respectively. The collector of each of the switching transistors Tr13 and Tr14 is connected to the power source. Each of constant current sources CG12 and CG13 is connected between the emitter of each of the switching transistors Tr13, Tr14 and each of grounding points, respectively.

The cross-point adjuster circuit CP1 has resistor R13 and R14, constant current sources CG14 and CG15, and a connector circuit J1. The constant current source CG14 withdraws current from the positive-phase data path connecting the collector of the switching transistor TR11 to the base of the switching transistor Tr13. The constant current source CG15 withdraws current from the negative-phase data path connecting the collector of the switching transistor TR12 to the base of the switching transistor Tr14. Resistors R13 and R14 are provided to isolate the constant current sources CG14 and CG15 from respective data paths. Control terminals for controlling the current withdrawn by the constant current sources CG14 and CG15 are grouped into one control terminal T1 by the connector circuit J1, such as a non-inverting operational amplifier.

The differential amplifier circuit DA2 in the second amplification stage A2 has load resistors R21, R22, switching transistors Tr21, Tr22, and a constant current source CG 21. The base of each of the switching transistors Tr21 and Tr22 is connected to the emitter of each of the switching transistors Tr13 and Tr14 in the first amplification stage A1, respectively. The collector of each of the switching transistors Tr21 and Tr22 is connected to the power source via load resistors R21 and R22, respectively. A constant current source CG21 is provided between the emitters of common-connected switching transistors Tr21, Tr22 and the grounding point. The limited output amplitude of the differential amplifier circuit DA2 is determined by the resistance value of the load resistors R21, R22 and the current value of the constant current source CG21.

The emitter follower circuit EF2 in the second amplification stage A2 has the switching transistors Tr23 and Tr24, and constant current sources CG22 and CG23. The base of each of the switching transistors Tr23 and Tr24 is connected to the collector of each of the switching transistors Tr21 and Tr22 in the differential amplifier circuit DA2, respectively. The collector of each of the switching transistors Tr23 and Tr24 is connected to the power source. Each of constant current sources CG22 and CG23 is provided between the emitter of each of the switching transistors Tr23, Tr24 and each of grounding points, respectively.

The cross-point adjuster circuit CP2 has resistor R23 and R24, constant current sources CG24 and CG25, and a connector circuit J2. The constant current source CG24 withdraws current from the positive-phase data path connecting the collector of the switching transistor Tr21 to the base of the switching transistor Tr23. The constant current source CG25 withdraws current from the negative-phase data path connecting the collector of the switching transistor Tr22 to the base of the switching transistor Tr24. Resistors R23 and R24 are provided to isolate the constant current sources CG24 and CG25 from respective data paths. Control terminals for controlling the current withdrawn by the constant current sources CG24 and CG25 are grouped into one control terminal T2 by the connector circuit J2, such as a non-inverting operational amplifier.

The differential amplifier circuit DA3 in the third amplification stage A3 has load resistors R31, R32, switching transistors Tr31, Tr32, and a constant current source CG 31. The base of each of the switching transistors Tr31 and Tr32 is connected to the emitter of each of the switching transistors Tr23 and Tr24 in the second amplification stage A2, respectively. The collector of each of the switching transistors Tr31 and Tr32 is connected to the power source via load resistors R31 and R32, respectively, and also connected to the positive-phase output terminal OUT_Posi and the negative-phase output terminal OUT_Nega, respectively. A constant current source CG31 is provided between the emitters of common-connected switching transistors Tr31, Tr32 and the grounding point. The limited output amplitude of the differential amplifier circuit DA3 is determined by the resistance value of the load resistors R31, R32 and the current value of the constant current source CG31.

The operation of the above-described driver circuit will be described. Control signals are inputted from the DAC (digital-to-analog converter) provided in an optical receiver-transmitter to control terminals T1 and T2, respectively. By the control signals, the currents withdrawn from the data path by respective constant current sources CG14, CG15, CG24, and CG25 are controlled. By thus controlling the positive-phase and negative-phase constant current sources in the cross-point adjuster circuit, the variation by the cross-point adjuster circuit is controlled.

In the first embodiment, since control terminal T1 and T2 are provided in cross-point adjuster circuits CP1 and CP2, respectively, the variation of cross points by the cross-point adjuster circuits CP1 and CP2 is independently controlled from the exterior. In the first embodiment, the adjusting range of the cross-point adjuster circuits CP1 and CP2 is identical at 50% to 75%.

Figure 3:
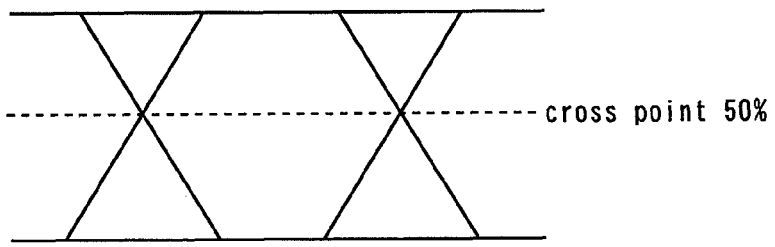
FIGS. 3 and 4 show the output wave forms of a driver circuit.
Figure 4:
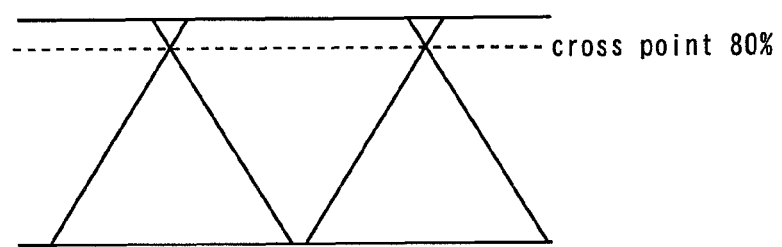

Here, the principle of cross-point adjustment will be described. FIGS. 3 and 4 show the output wave forms of a driver circuit (eye patterns). When the differential wave form of the differential amplifier circuit in the driver circuit is perfectly symmetric, an electric wave form wherein the cross point is 50% is outputted as shown in FIG. 3. Specifically, the cross point of 50% of input is maintained and outputted. On the other hand, when the positive-phase and negative-phase DC levels of the differential wave form of the differential amplifier circuits are shifted, an electric wave form wherein the cross point is shifter from 50% (cross point: 80%) is outputted as shown in FIG. 4.

Figure 5:
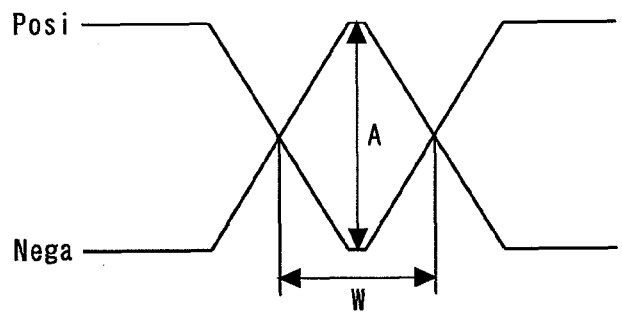
FIGS. 5 and 6 show the output wave forms of the cross-point adjuster circuit.
Figure 6:
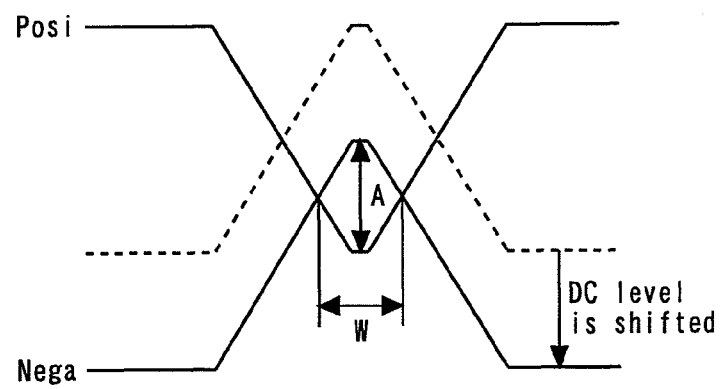

In the first embodiment, the cross-point adjuster circuits CP1 and CP2 are provided to shift the DC levels of the differential wave form of the differential amplifier circuits DA1 and DA2. Here, only the cross-point adjuster circuit CP1 will be considered. FIGS. 5 and 6 show the output wave forms of the cross-point adjuster circuit CP1. When the constant current sources CG14 and CG15 withdraw the current of the same value, the DC levels of the differential wave forms are the same as shown in FIG. 5. As a result, the electric wave form wherein the cross point is 50% is outputted as shown in FIG. 3. On the other hand, when the constant current sources CG14 and CG15 withdraw the current of different values, the DC levels of the differential wave forms are different as shown in FIG. 6. As a result, the electric wave form wherein the cross point is shifted from 50% is outputted as shown in FIG. 4.

Figure 7:
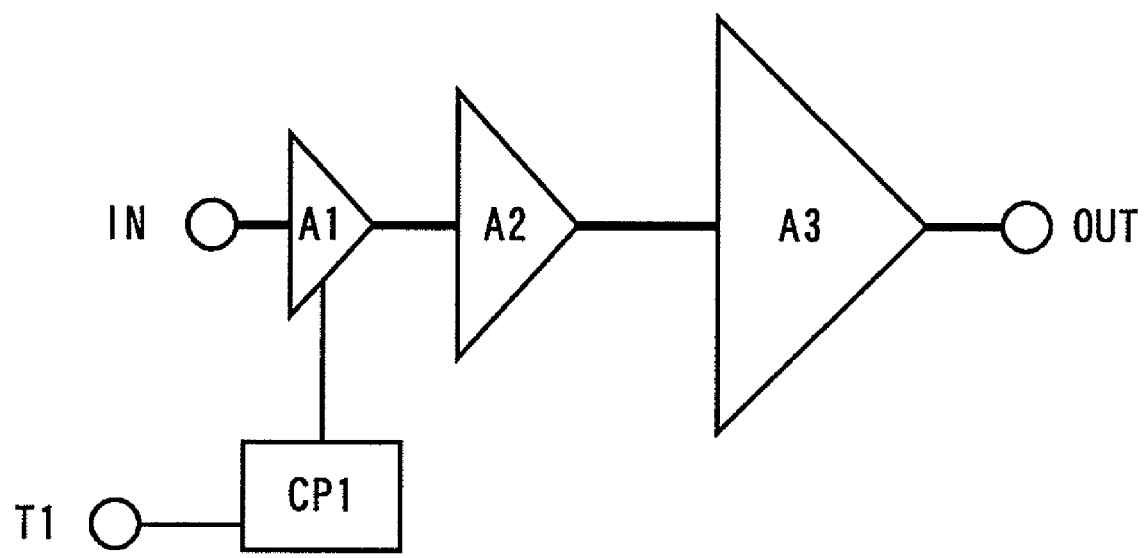
FIG. 7 is a block diagram showing a comparative example of driver circuits.

Next, the effect of the driver circuit according to the first embodiment will be described comparing with a comparative example. FIG. 7 is a block diagram showing a comparative example of driver circuits. In the comparative example, one cross-point adjuster circuit CP1 is connected to the first amplification stage A1. In the case shown in FIG. 6, in the bit when the logic level is 1 (Posi is H level and Nega is L level) in the node wherein the DC bias is shifted, the pulse width W and pulse amplitude A of the output wave form to be differentially amplified in the next stage are narrowed. As the pulse amplitude A is narrower, larger gain is required in the next-stage amplifier circuit. However, since the product of the gain of an amplifier circuit and frequency (GB product) is generally limited, the frequency band in the next-stage amplifier circuit is narrowed. In the comparative example shown in FIG. 7, when a cross point of a high percentage is adjusted, since there is no way other than using only the cross-point adjuster circuit CP1, and the pulse width W and pulse amplitude A are much narrowed and the frequency band of the second amplification stage is narrowed, favorable output wave form cannot be obtained.

On the other hand, in the first embodiment, cross-point adjuster circuits CP1 and CP2 are disposed in each of a plurality of locations in the multi-stage amplifier circuit. Thereby, the load to the frequency band is dispersed, and the frequency band required in the multi-stage amplifier circuit can be relieved. For example, when the output wave form of 80% cross point is finally obtained, each of the two cross-point adjuster circuits CP1 and CP2 has only to be subjected to 65% cross-point variation. Therefore, the multi-stage amplifier circuit has only to drive the wave form of a band in the middle of the wave forms shown in FIG. 5 and FIG. 6, but not a broad band wave form as shown in FIG. 6. Therefore, even when an electric wave form wherein the cross point is shifted from 50% is outputted, a favorable output wave form (low jitter, high-speed Tr/Tf, etc.) can be maintained.

In the first embodiment, although the case wherein tree differential amplification stages is described, the present invention is not limited thereto, but a plurality of differential amplification stages have only to be connected in series. In addition, at least two cross-point adjuster circuits have only to be connected to at least two differential amplification stages among a plurality of differential amplification stages.

Second Embodiment

Although the adjusting range of respective cross-point adjuster circuits CP1 and CP2 is identical in the first embodiment, the adjusting range of the both is different from each other in the second embodiment. Specifically, the adjusting range of the cross-point adjuster circuit CP1 is 50% to 90% (rough adjustment), and the adjusting range of the cross-point adjuster circuit CP2 is 50% to 60% (fine adjustment). Other configurations are the same as the configurations of the first embodiment.

Figure 8:
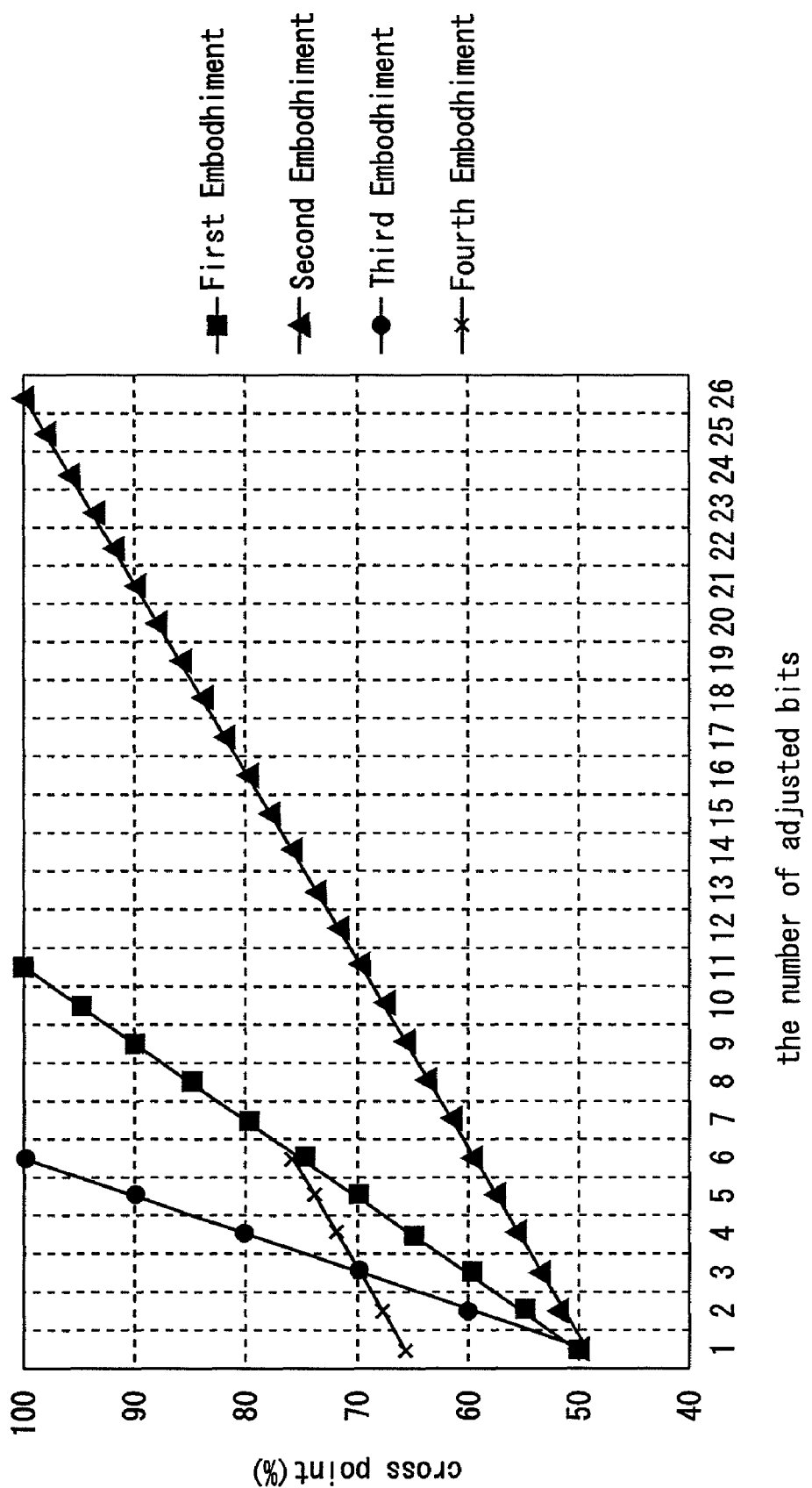
FIG. 8 is a graph showing cross-point adjusting characteristics of driver circuits according to the first to fourth embodiments of the present invention.

FIG. 8 is a graph showing cross-point adjusting characteristics of driver circuits according to the first to fourth embodiments of the present invention. The abscissa indicates the number of adjusted bits; and the ordinate indicates cross points. Larger numbers of adjusted bits on the abscissa enable the finer adjustment of cross points in the ordinate and are more effective. As shown in FIG. 8, the second embodiment enables finer adjustment than the first embodiment.

Third Embodiment

Figure 9:
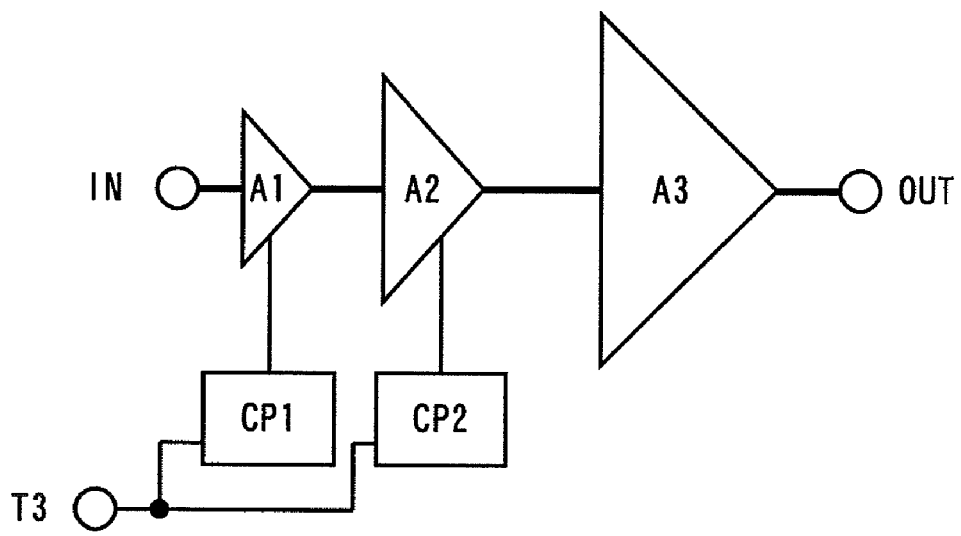
FIG. 9 is a block diagram showing a driver circuit according to the third embodiment of the present invention.

FIG. 9 is a block diagram showing a driver circuit according to the third embodiment of the present invention. Two cross-point adjuster circuits CP1 and CP2 are connected to one control terminal T3 in common. The cross-point variation by the two cross-point adjuster circuits CP1 and CP2 is externally controlled via a control terminal T3 in common. Other configurations are the same as the configurations of the first embodiment.

Thereby, since only one DAC for controlling is required, the number of parts can be reduced, and miniaturization and cost reduction can be realized.

Fourth Embodiment

Figure 10:
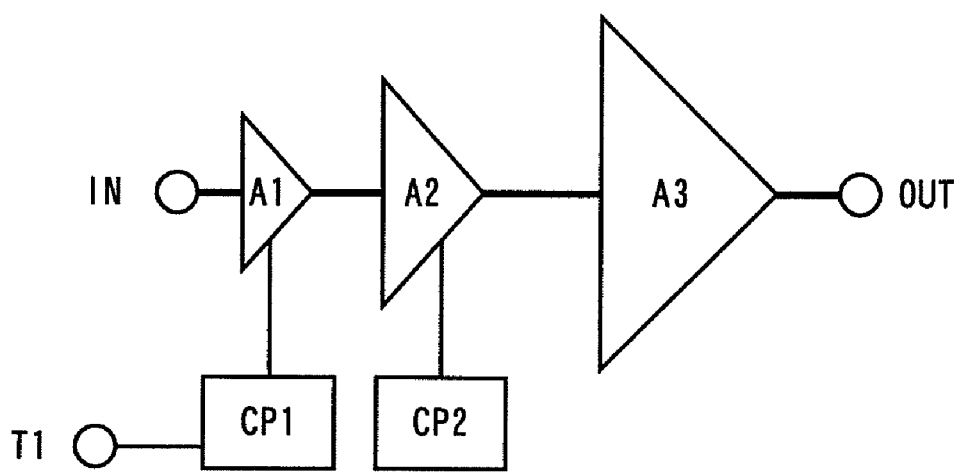
FIG. 10 is a block diagram showing a driver circuit according to the fourth embodiment of the present invention.

FIG. 10 is a block diagram showing a driver circuit according to the fourth embodiment of the present invention. The cross-point variation by the cross-point adjuster circuit CP1 is externally controlled; and the cross-point variation by the cross-point adjuster circuit CP2 is fixed. Other configurations are the same as the configurations of the first embodiment.

Thereby, since only one DAC for controlling is required, the number of parts can be reduced, and miniaturization and cost reduction can be realized. As shown in FIG. 8, the fine adjustment of cross points can be performed even within a narrow range. Therefore, the fourth embodiment is effective for applications used only within a limited cross-point adjusting range (e. g., 65 to 75%).

The equivalent effect can also be obtained when the cross-point variation by the cross-point adjuster circuit CP2 is externally controlled; and the cross-point variation by the cross-point adjuster circuit CP1 is fixed.

Fifth Embodiment

Figure 11:
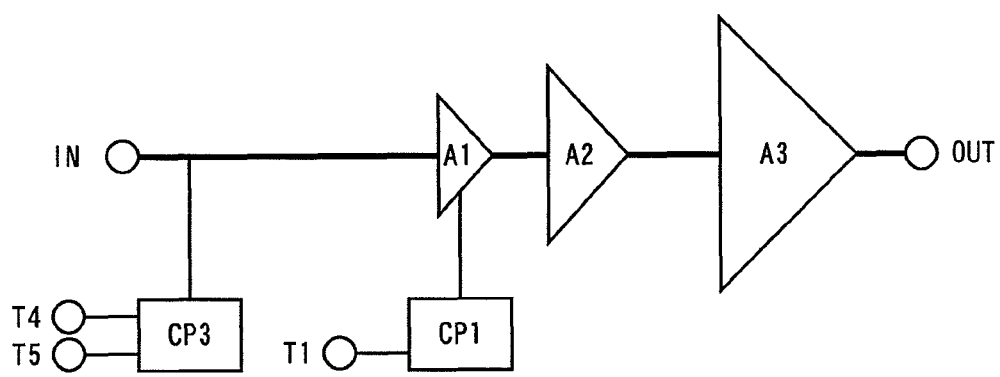
FIG. 11 is a block diagram showing a driver circuit according to the fifth embodiment of the present invention.

FIG. 11 is a block diagram showing a driver circuit according to the fifth embodiment of the present invention. A first cross-point adjuster circuit CP3 is connected to the input terminal IN; and a second cross-point adjuster circuit CP1 is connected to the first amplification stage A1. The first cross-point adjuster circuit CP3 controls at least one of positive-phase and negative-phase DC levels of the input signals to adjust the cross point of the input signals. The second cross-point adjuster circuit CP1 controls at least one of positive-phase and negative-phase DC levels of the first amplification stage A1 to adjust the cross point of the input signals of the first amplification stage A1. Other configurations are the same as the configurations of the first embodiment.

Figure 12:
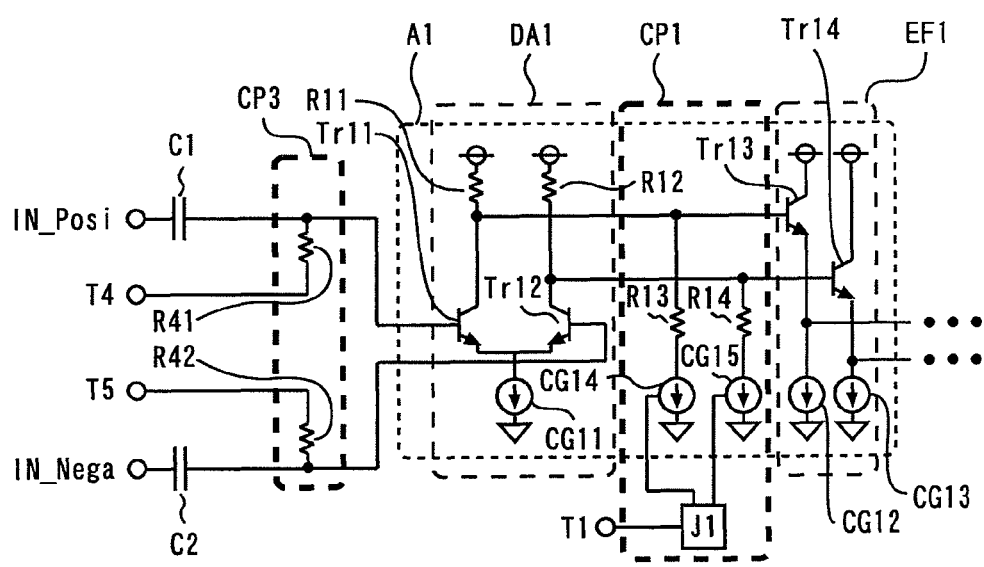
FIG. 12 is a circuit diagram showing a driver circuit according to the fifth embodiment of the present invention.

FIG. 12 is a circuit diagram showing a driver circuit according to the fifth embodiment of the present invention. In FIG. 12, the second amplification stage A2 and the third amplification stage A3 are omitted. The configurations of first amplification stage A1 and the cross-point adjuster circuit CP1 are the same as the configurations of those in the first embodiment.

Blocking capacitors C1 and C2 used for AC coupling (capacitive coupling) are connected to the positive-phase input terminal IN_Posi and the negative-phase input terminal IN_Nega, respectively. The first cross-point adjuster circuit CP3 has 50-Ω terminated terminating resistors R41 and R42 for reducing reflection. A control terminal T4 is connected via the terminating resistor R41 to the positive-phase input terminal IN_Posi and the base of a switching transistor TR11 in the differential amplifier circuit DA1. A control terminal T5 is connected via the terminating resistor R42 to the negative-phase input terminal IN_Nega and the base of a switching transistor TR12 in the differential amplifier circuit DA1.

The operation of the above-described driver circuit will be described. In an ordinary differential amplifier of an AC-coupling system, the control terminals T4 and T5 are short-circuited, forming a bilaterally symmetric wave form (cross point=50%). While in the fifth embodiment, control signals are inputted from DAC to each of the control terminals T4 and T5. These control signals determine the DC level of the positive-phase input terminal IN_Posi and the negative-phase input terminal IN_Nega, respectively. Thereby, the cross point of input signals is controlled. In the same manner as in the first embodiment, control signals are inputted from DAC to the control terminal T1, and cross-point variation by the cross-point adjuster circuit CP1 is controlled. The cross-point variation by the first and second cross-point adjuster circuits CP3 and CP1 are individually controlled from the exteriors, respectively.

In the fifth embodiment, as described above, the first and second cross-point adjuster circuits CP3 and CP1 are disposed in the input terminal IN and the first amplification stage A1 in the multi-stage amplifier circuit, respectively. Thereby, since the load to the frequency band is dispersed, the frequency band required by the multi-stage amplifier circuit can be relieved. Therefore, even when an electric wave form wherein the cross point is shifter from 50% is outputted, a favorable output wave form (low jitter, high-speed Tr/Tf, etc.) can be maintained.

In the fifth embodiment, although the case wherein three differential amplification stages are used is described, the present invention is not limited thereto, but has only to have a plurality of differential amplification stages connected in series. In addition, a second cross-point adjuster circuit has only to be connected to any one of a plurality of differential amplification stages. The control terminals T4 and T5 can be connected in common to form one control terminal.

Sixth Embodiment

Figure 13:
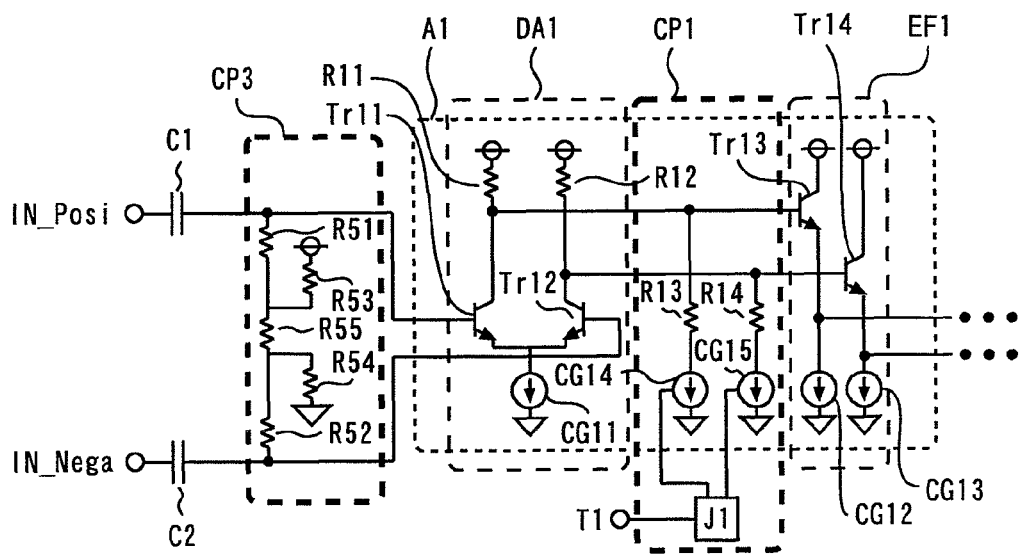
FIG. 13 is a circuit diagram showing a driver circuit according to the sixth embodiment of the present invention.

FIG. 13 is a circuit diagram showing a driver circuit according to the sixth embodiment of the present invention. The sixth embodiment is different from the fifth embodiment in the configuration of the first cross-point adjuster circuit CP3. The cross-point adjuster circuit is of a both-ends terminated type.

The first cross-point adjuster circuit CP3 has first and second 50-Ω terminating resistors R51, R52, and first to third 50-Ω resistors R53, R54, and R 55. An end of the first terminating resistor R51 is connected to a positive-phase input terminal IN_Posi. An end of the second terminating resistor R51 is connected to a negative-phase input terminal IN_Nega. An end of the first resistor R53 is connected to the other end of the first terminating resistor R51, and the other end of the first resistor R53 is connected to a high potential (first potential). An end of the second resistor R54 is connected to the other end of the second terminating resistor R52, and the other end of the second resistor R54 is connected to a low potential (second potential). An end of the third resistor R55 is connected to the other end of the first terminating resistor R51 and an end of the first resistor R53. The other end of the third resistor R55 is connected to the other end of the second terminating resistor R52 and an end of the second resistor R54.

In general both-ends terminated types, since the first terminating resistor R51 and the second terminating resistor R52 are short-circuited to reflect the DC bias value determined by resistance dividing to positive and negative phases, no DC bias shifting occurs. While in the sixth embodiment, third resistor R55 is inserted between the first terminating resistor R51 and the second terminating resistor R52. Thereby, the DC bias values of the positive and negative phases of input signals are shifted, and the cross point of input signals is shifted from 50%. As the resistance value of the third resistor R55 is larger, the cross point shifts larger. Therefore, the equivalent effect as the fifth embodiment can be obtained.

Seventh Embodiment

Figure 14:
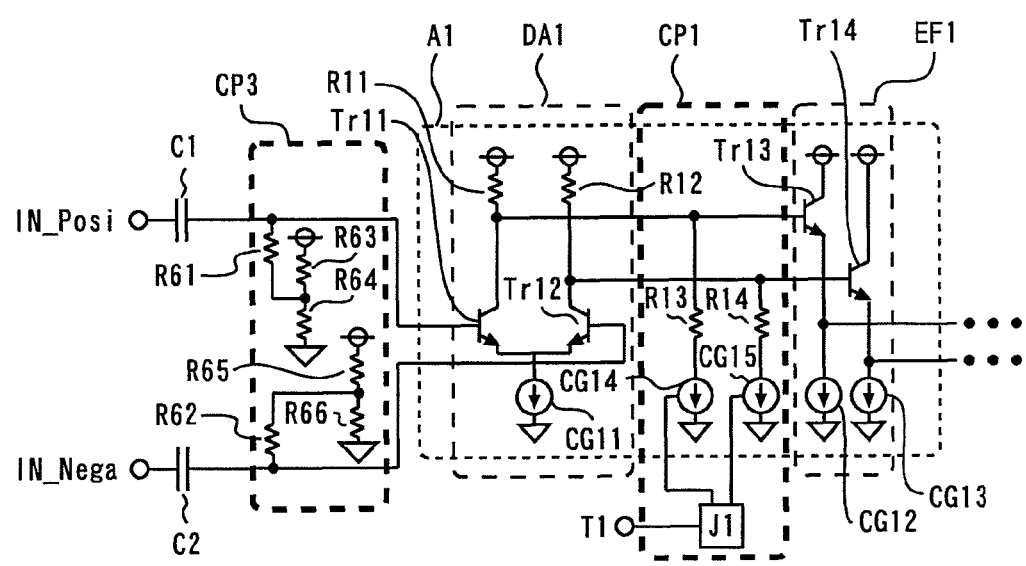
FIG. 14 is a circuit diagram showing a driver circuit according to the seventh embodiment of the present invention.

FIG. 14 is a circuit diagram showing a driver circuit according to the seventh embodiment of the present invention. The seventh embodiment is different from the fifth embodiment in the configuration of the first cross-point adjuster circuit CP3. The cross-point adjuster circuit is of a single-phase terminated type. Specifically, different from the sixth embodiment, a circuit for setting DC bias is independently provided in each of the positive-phase input terminal IN_Posi and the negative-phase input terminal IN_Nega.

The first cross-point adjuster circuit CP3 has 50-Ω terminating resistors R61, R62, and 50-Ω resistors R63, R64, R 65, and R66. An end of the terminating resistor R61 is connected to the positive-phase input terminal IN_Posi via a capacitor C1; and an end of the terminating resistor R62 is connected to the negative-phase input terminal IN_Nega via a capacitor C2. Resistors R63 and R64 are connected in series between a high potential and a low potential; and the other end of the terminating resistor R61 is connected to the connecting point of these resistors. Resistors R65 and R66 are connected in series between the high potential and the low potential; and the other end of the terminating resistor R62 is connected to the connecting point of these resistors.

The resistors R63 and R64 resistively divide a prescribed constant voltage to constitute a first resistively divided circuit that outputs the divided voltage to the positive-phase input terminal IN_Posi. The resistors R65 and R66 resistively divide a prescribed constant voltage to constitute a second resistively divided circuit that outputs the divided voltage to the negative-phase input terminal IN_Nega.

In general single-phase terminating types, for maintaining the symmetry of differentiation, the output voltage of the first resistance-dividing circuit is identical to the output voltage of the second resistance-dividing circuit (the resistive constants of both circuits are the same). While in the seventh embodiment, the output voltage of the first resistance-dividing circuit is different from the output voltage of the second resistance-dividing circuit. Thereby, the DC bias value of input signals in the positive phase shifts from the DC bias value of input signals in the negative phase, and the cross point of the input signals is shifted from 50%. Therefore, the effect equivalent to the effect of the fifth embodiment can be obtained.

In the first to seventh embodiments described above, the switching transistor is not limited to a bipolar transistor, but the equivalent effect can be obtained when a MOS transistor is used. In this case, the emitter is replaced by the source, the base is replaced by the gate, and the collector is replaced by the drain.

The equivalent effect can be obtained when a driver circuit according to the first to seventh embodiments is used as an integrated circuit (IC) or a part of as an IC; and can be used as a driver IC to reduce the size. In the fifth to seventh embodiments, the blocking capacitors C1 and C2 can be disposed in the exterior of the integrated circuit, not within the integrated circuit.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-277629, filed on Oct. 29, 2008 including specification, claims, drawings and summary, on which the Convention priority of the present application is based, are incorporated herein by reference in its entirety.

What is claimed is:

1. A driver circuit comprising:
   a plurality of differential amplification stages connected in series, and
   at least two cross-point adjuster circuits respectively connected to at least two differential amplification stages of said plurality of differential amplification stages, wherein said cross-point adjuster circuits adjust positive-phase and negative-phase DC levels of a corresponding differential amplification stage and adjust a cross point of the output signals of the corresponding differential amplification stage.

2. The driver circuit according to claim 1, wherein cross-point variation by each of said at least two cross-point adjuster circuits is individually and externally controlled.

3. The driver circuit according to claim 2, wherein cross-point adjusting ranges of respective cross-point adjuster circuits are the same.

4. The driver circuit according to claim 2, wherein cross-point adjusting ranges of respective cross-point adjuster circuits are different.

5. The driver circuit according to claim 1, wherein cross-point variation by each of said at least two cross-point adjuster circuits is controlled commonly and externally.

6. The driver circuit according to claim 1, wherein cross point variation by a part of said at least two cross-point adjuster circuits is controlled externally, and the cross point variation by remaining ones of said at least two cross-point adjuster circuits is fixed.

7. A driver circuit comprising:
   a plurality of differential amplification stages connected in series,
   a first cross-point adjuster circuit connected to the input terminal of said plurality of differential amplification stages, and
   a second cross-point adjuster circuit connected to any one of said plurality of differential amplification stages, wherein
   said first cross-point adjuster circuit controls at least one of positive-phase and negative-phase DC levels of input signals and adjusts a cross point of the input signals, and
   said second cross-point adjuster circuit controls at least one of the positive-phase and negative-phase DC levels of a corresponding differential amplification stage and adjusts a cross point of the output signals of the corresponding differential amplification stage.

8. The driver circuit according to claim 7, wherein cross point variation by each of said first and second cross-point adjuster circuits is individually and externally controlled.

9. The driver circuit according to claim 7, wherein
   said input terminal comprises a positive-phase input terminal at which the positive-phases of the input signals are input, and a negative-phase input terminal at which the negative-phases of the input signals are input; and
   said first cross-point adjuster circuit comprises:
      a first terminating resistor having a first end connected to said positive-Phase input terminal,
      a second terminating resistor having a first end connected to said negative-phase input terminal,
      a first resistor having a first end connected to a second end of said first terminating resistor, and a second end connected to a first potential,
      a second resistor having a first end connected to a second end of said second terminating resistor, and a second end connected to a second potential, and
      a third resistor having a first end connected to the second end of said first terminating resistor and the first end of said first resistor, and a second end connected to the second end of said second terminating resistor and the first end of said second resistor.

10. The driver circuit according to claim 7, wherein
   said input terminal comprises a positive-phase input terminal at which the positive-phase of said input signals are input, and a negative-phase input terminal at which the negative-phase of said input signals are input; and
   said first cross-point adjuster circuit comprises:
      a first resistance dividing circuit that resistively divides a prescribed constant voltage to output a divided voltage to said positive-phase input terminal, and
      a second resistance dividing circuit that resistively divides a prescribed constant voltage to output a divided voltage to said negative-phase input terminal; and
      the output divided voltage of said first resistance dividing circuit is different from the output divided voltage of said second resistance dividing circuit.

* * * * *